(12) United States Patent
Yang

(10) Patent No.: US 10,685,990 B2
(45) Date of Patent: Jun. 16, 2020

(54) DISPLAY PANEL AND DISPLAY DEVICE

(71) Applicant: Wuhan China Star Optoelectronics Technology Co., LTD., Wuhan (CN)

(72) Inventor: Zuyou Yang, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/210,863

(22) Filed: Dec. 5, 2018

(65) Prior Publication Data

US 2019/0305012 A1    Oct. 3, 2019

(30) Foreign Application Priority Data

Mar. 29, 2018  (CN) .......................... 2018 1 0272984

(51) Int. Cl.
| | | |
|---|---|---|
| *H01L 27/32* | (2006.01) | |
| *H01L 27/12* | (2006.01) | |
| *G09G 3/20* | (2006.01) | |

(52) U.S. Cl.
CPC .......... *H01L 27/1244* (2013.01); *G09G 3/20* (2013.01); *G09G 2300/0413* (2013.01); *G09G 2300/0426* (2013.01)

(58) Field of Classification Search
CPC ......... G02F 1/136286; G02F 1/134309; H01L 27/3223
See application file for complete search history.

(56) References Cited

U.S. PATENT DOCUMENTS

| | | | | |
|---|---|---|---|---|
| 2010/0097538 A1* | 4/2010 | Ota | ................... | G02F 1/136204 349/48 |
| 2012/0086878 A1* | 4/2012 | Mochiku | ............... | G02F 1/1339 349/5 |
| 2014/0292626 A1* | 10/2014 | Park | ..................... | G09G 3/3611 345/87 |

* cited by examiner

*Primary Examiner* — Thomas L Dickey
(74) *Attorney, Agent, or Firm* — Kirton McConkie; Evan R. Witt

(57) ABSTRACT

A display panel and a display device are provided. The display panel includes a display area configured to display an image and a dummy pixel area disposed outside of the display area. The dummy pixel area has a plurality of dummy pixels disposed therein. Each dummy pixel includes a pixel protection unit. The dummy pixels are defined by crisscrossing data metal lines and gate metal lines in a vertical direction and a horizontal direction, respectively. A pattern of a projection of a semiconductor layer on the horizontal plane intersects the corresponding data metal line, is separated from the corresponding gate metal line, and is disposed toward a center of each dummy pixel, to prevent the display device from poor display due to contact between the semiconductor layer and the gate metal lines in the dummy pixel area when electrostatic discharge occurs.

8 Claims, 1 Drawing Sheet

DISPLAY PANEL AND DISPLAY DEVICE

FIELD OF INVENTION

The present disclosure relates to the field of display technologies, and more particularly to a display panel and a display device.

BACKGROUND OF INVENTION

Liquid crystal display devices are widely used as display devices for information communication terminals, such as computers and television receivers. In addition, organic light emitting diode (OLED) display devices, field emission devices (FEDs), and the like, as thin display panels, are well known to those skilled in the art. The liquid crystal display device is a device that displays an image by controlling orientation of liquid-crystal molecules enclosed between two substrates by changing an electric field, thereby controlling a degree of transmission light passing through the two substrates and the liquid-crystal molecules.

In the liquid crystal display device, a display panel configured to apply a voltage corresponding to a predetermined gradation value to each pixel of an image includes thin film transistors configured to apply the voltage corresponding to the gradation value to each pixel. In general, a gate of the thin film transistor of the pixel in one row of the image is connected to a signal line (hereinafter referred to as "gate signal line"), and a drive circuit is controlled so as to output a voltage for turning on the thin film transistor to the gate signal line in order. In addition, at an edge of a display area, dummy pixels are arranged outside the display area so that structural changes and electromagnetic changes due to the edge of the display area do not affect display.

Currently, low temperature poly-silicon (LTPS) display devices and single crystalline silicon thin film transistor display devices have no electrostatic discharge (ESD) protection structure in display areas. A dummy pixel area of the display device is a high incidence area of ESD. Electrostatic discharge of a dummy pixel causes a semiconductor layer in the dummy pixel area of the display device to come into contact with a gate metal line and cause a short circuit between the semiconductor layer and the gate metal line, resulting in poor display when the display device displays. Therefore, it is necessary to provide a display device to solve problems existing in existing technologies.

SUMMARY OF INVENTION

An object of the present disclosure is to provide a display panel and a display device to solve problems that a semiconductor layer in a dummy pixel area is in contact with a gate metal line due to electrostatic discharge occurring in the dummy pixel area in existing display panel and display device, resulting in poor display when the display device displays.

To achieve the above object, an embodiment of the present disclosure provides a display panel. The display panel includes a display area configured to display an image and a dummy pixel area disposed outside of the display area. The dummy pixel area has a plurality of dummy pixels disposed therein. Each dummy pixel includes a pixel protection unit. The dummy pixels are defined by crisscrossing data metal lines and gate metal lines in a vertical direction and a horizontal direction, respectively. The pixel protection unit includes a metal layer and a semiconductor layer. The metal layer includes a first metal and a second metal, and the first metal and the second metal are correspondingly disposed above two ends of the semiconductor layer. A pattern of a projection of the first metal on a horizontal plane overlaps with a corresponding data metal line, a pattern of a projection of the second metal on the horizontal plane is separated from the corresponding data metal line and a corresponding gate metal line, and a pattern of a projection of the semiconductor layer on the horizontal plane intersects the corresponding data metal line, is separated from the corresponding gate metal line, and is disposed toward a center of each dummy pixel.

In an embodiment of the present disclosure, the semiconductor layer is U-shaped, and an opening of the semiconductor layer correspondingly faces each dummy pixel.

In an embodiment of the present disclosure, one of the two ends of the semiconductor layer is connected to the first metal, and the other of the two ends of the semiconductor layer is connected to the second metal.

In an embodiment of the present disclosure, the display panel further includes a plurality of pixels having a plurality of thin film transistors disposed in the display area, each of the thin film transistors and the pixel protection unit are same except for positions of their projections relative to the corresponding gate metal line on the horizontal plane.

In an embodiment of the present disclosure, the data metal lines include a plurality of pixel data metal lines and a plurality of dummy pixel data metal lines, a projection of a source of each of the thin film transistors overlaps with a projection of a corresponding pixel data metal line on the horizontal plane, and a projection of the second metal overlaps with a projection of a corresponding dummy pixel data metal line on the horizontal plane.

In an embodiment of the present disclosure, the corresponding gate metal line extends across a semiconductor layer of each of the thin film transistors.

In an embodiment of the present disclosure, the second metal includes an inter-layer insulating via.

An embodiment of the present disclosure provides a display panel device including a display panel and a backlight module. The display panel includes a display area configured to display an image and a dummy pixel area disposed outside of the display area. The dummy pixel area has a plurality of dummy pixels disposed therein. Each dummy pixel includes a pixel protection unit. The dummy pixels are defined by crisscrossing data metal lines and gate metal lines in a vertical direction and a horizontal direction, respectively. The pixel protection unit includes a metal layer and a semiconductor layer. The metal layer includes a first metal and a second metal, and the first metal and the second metal are correspondingly disposed above two ends of the semiconductor layer. A pattern of a projection of the first metal on a horizontal plane overlaps with a corresponding data metal line, a pattern of a projection of the second metal on the horizontal plane is separated from the corresponding data metal line and a corresponding gate metal line, and a pattern of a projection of the semiconductor layer on the horizontal plane intersects the corresponding data metal line, is separated from the corresponding gate metal line, and is disposed toward a center of each dummy pixel.

In an embodiment of the present disclosure, the semiconductor layer is U-shaped, and an opening of the semiconductor layer correspondingly faces each dummy pixel.

In an embodiment of the present disclosure, one of the two ends of the semiconductor layer is connected to the first metal, and the other of the two ends of the semiconductor layer is connected to the second metal.

An advantage of the embodiment of the present disclosure provides a display panel and a display device. A pattern of a projection of a semiconductor layer on the horizontal plane is separated from the corresponding gate metal line and is disposed toward a center of each dummy pixel, so as to prevent the display device from displaying poorly due to contact between the semiconductor layer and the gate metal lines in the dummy pixel area when electrostatic discharge occurs, thereby improving the display device yield.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
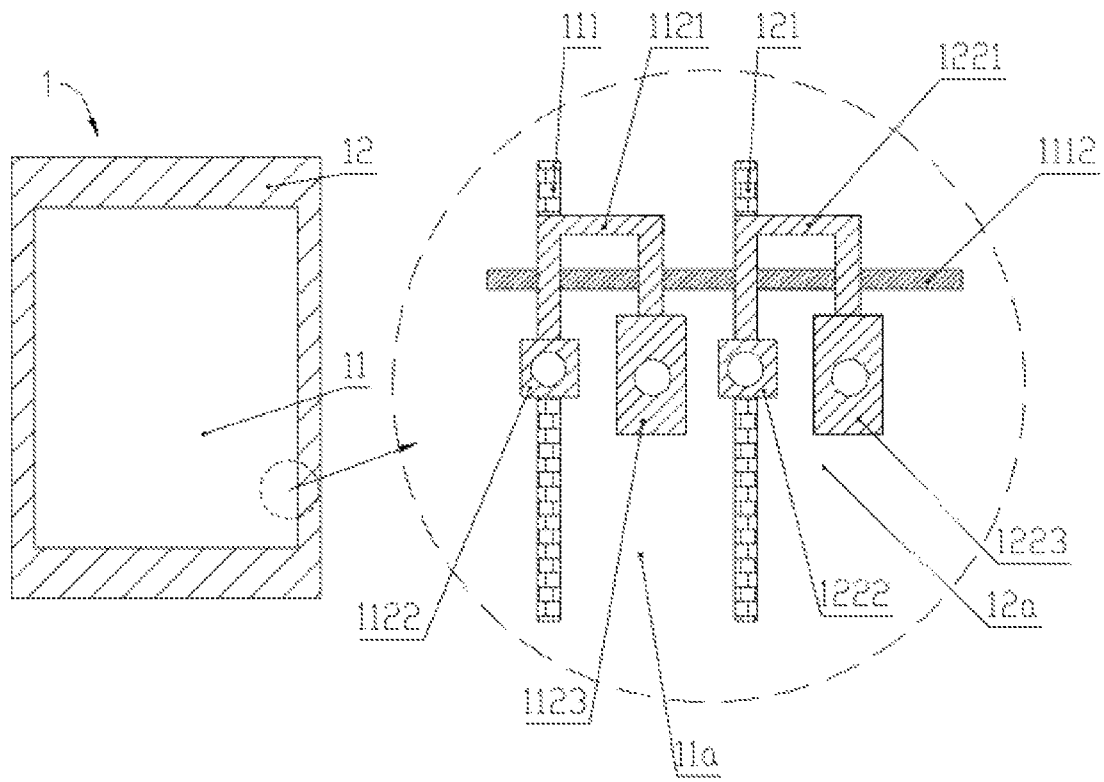
FIG. 1 is a schematic structural diagram of a pixel area and a dummy pixel area in a conventional display panel.

The embodiments described herein with reference to the accompanying drawings are explanatory, illustrative, and used to generally understand the present disclosure. Furthermore, directional terms described by the present disclosure, such as top, bottom, front, rear, left, right, inner, outer, side, etc., are only directions by referring to the accompanying drawings, and thus the used terms are used only for the purpose of describing embodiments of the present disclosure and are not intended to be limiting of the present disclosure. In the drawings, modules with similar structures are labeled with the same reference number.

The present discourse provides a display panel and a display device to solve problems existing in existing display panel and display device that the existing display device has poor display due to contact between a semiconductor layer and a gate metal lines in a dummy pixel area when electrostatic discharge occurs.

The following further describes the present disclosure with reference to accompanying drawings and embodiments.

Figure 2:
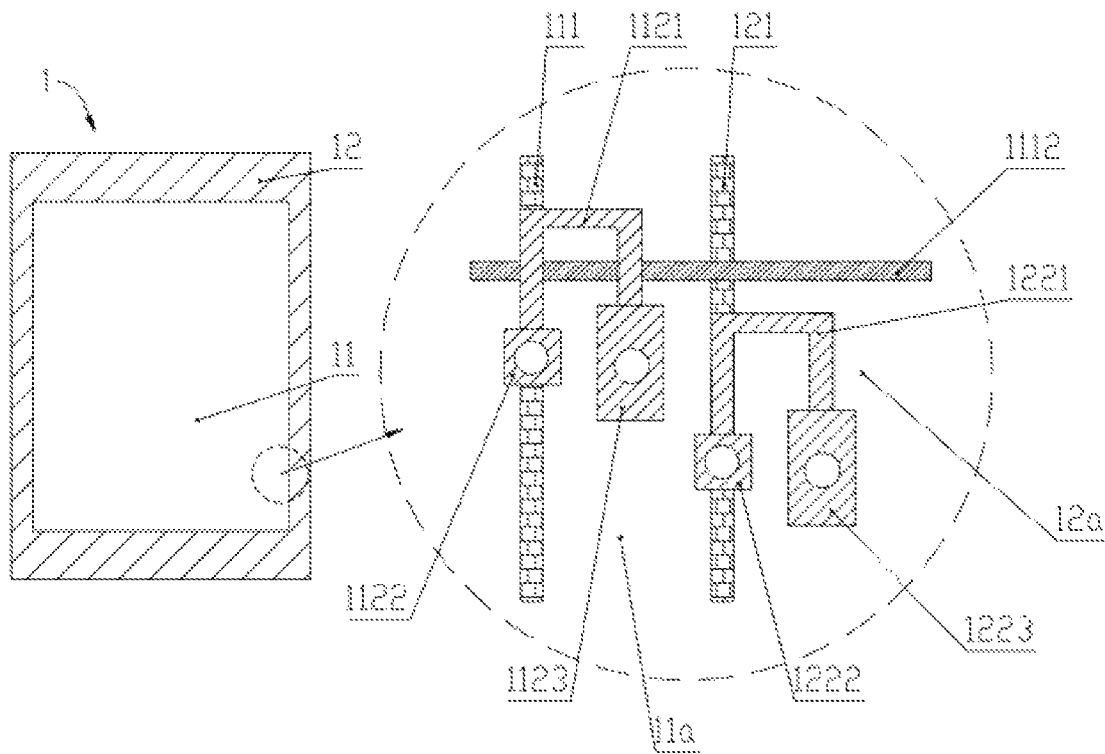
FIG. 2 is a schematic structural diagram of a pixel area and a dummy pixel area in a display panel according to an embodiment of the present disclosure.

FIG. 1 is a schematic structural diagram of a pixel area and a dummy pixel area in a conventional display panel. FIG. 2 is a schematic structural diagram of a pixel area and a dummy pixel area in a display panel according to an embodiment of the present disclosure.

Refer to FIG. 2, an embodiment of the present disclosure provides a display panel 1. The display panel 1 includes a display area 11 configured to display an image and a dummy pixel area 12 disposed outside of the display area 11. The dummy pixel area 12 has a plurality of dummy pixels 12a disposed therein. Each dummy pixel 12a includes a pixel protection unit 122. The dummy pixels 12a are defined by crisscrossing data metal lines 111 and 121 and gate metal lines 1112 in a vertical direction and a horizontal direction, respectively. The pixel protection unit 122 includes a first metal 1222, a second metal 1223, and a semiconductor layer 1221. A pattern of a projection of the first metal 1222 on a horizontal plane overlaps with a corresponding data metal line 121, a pattern of a projection of the second metal 1223 on the horizontal plane is separated from the corresponding data metal line 121 and a corresponding gate metal line 1112, and a pattern of a projection of the semiconductor layer 1221 on the horizontal plane intersects the corresponding data metal line 121, is separated from the corresponding gate metal line 1112, and is disposed toward a center of each dummy pixel 12a.

In details, in the embodiment of the present disclosure, a horizontal projection plane refers to a plane where the gate metal line 1112 is located, that is, a projection pattern of the pixel protection unit 122 on a plane where the gate metal line 1112 is located.

In a general structure of a thin film transistor, a thin insulating layer is disposed between the semiconductor layer 1221 of the pixel protection unit 122 and the gate metal line 1112, the insulating layer can prevent the semiconductor layer 1221 from contacting the gate metal line 1112, and a short circuit is thus prevented. A dummy pixel area 12 of the display panel 1 is a high incidence area of electrostatic discharge (ESD). When the ESD occurs in the dummy pixel area 12, the semiconductor layer 1221 and the gate metal line 1112 are possible to be brought into contact to cause a short circuit. In the embodiment, by moving the pixel protection unit 122 in the dummy pixel area 12a downward relative to a thin film transistor 112, the semiconductor layer 1221 intersects with the data metal line 121 and is separated from the gate metal line 1112 on the horizontal projection plane. That is, when the ESD occurs, it is also possible to effectively prevent the semiconductor layer 1221 and the gate metal line 1112 from being in contact with each other, and a short circuit is thus prevented.

Further, the semiconductor layers (including 1221 and 1121, if not illustrated below, all denoted by 1221) are U-shaped, and an opening of the semiconductor layer 1221 correspondingly faces each dummy pixel 12a.

In the display panel 1, one of the two ends of the semiconductor layer 1221 is connected to the first metal 1222, and the other of the two ends of the semiconductor layer 1221 is connected to the second metal 1223.

Further, each thin film transistors 11a and the pixel protection unit 12a are same except for positions of their projections relative to the corresponding gate metal line 1112 on the horizontal plane. Therefore, the embodiment improves the structure of the display panel 1 while there is no need to add an extra masking process and it will not affect the other processes on the display panel 1.

The second metal 1223 of the pixel protection unit 122 includes an inter-layer insulating via. In the embodiment, the second metal 1223 of the pixel protection unit 122 and the inter-layer insulating via are moved synchronously to a center of the dummy pixel 12a to further accurately determine a position of the pixel protection unit 122 in the embodiment.

In details, the data metal lines include a plurality of pixel data metal lines 111 and a plurality of dummy pixel data metal lines 121, a projection of a source 1122 of each of the thin film transistors 11a overlaps with a projection of a corresponding pixel data metal line 111 on the horizontal plane, and a projection of the first metal 1222 of the pixel protection unit 122 overlaps with a projection of a corresponding dummy pixel data metal line 121 on the horizontal plane.

The corresponding gate metal line 1112 extends across a semiconductor layer 1121 of each of the thin film transistors 11a.

An embodiment of the present disclosure provides a display panel device including a display panel and a backlight module. The display panel includes a display area configured to display an image and a dummy pixel area disposed outside of the display area. The dummy pixel area has a plurality of dummy pixels disposed therein. Each dummy pixel includes a pixel protection unit. The dummy pixels are defined by crisscrossing data metal lines and gate metal lines in a vertical direction and a horizontal direction, respectively. The pixel protection unit includes a metal layer and a semiconductor layer. The metal layer includes a first metal and a second metal, and the first metal and the second metal are correspondingly disposed above two ends of the semiconductor layer. A pattern of a projection of the first metal on a horizontal plane overlaps with a corresponding data metal line, a pattern of a projection of the second metal on the horizontal plane is separated from the corresponding data metal line and a corresponding gate metal line, and a pattern of a projection of the semiconductor layer on the horizontal plane intersects the corresponding data metal line, is separated from the corresponding gate metal line, and is disposed toward a center of each dummy pixel.

The semiconductor layer is U-shaped, and an opening of the semiconductor layer correspondingly faces each dummy pixel.

One of the two ends of the semiconductor layer is connected to the first metal, and the other of the two ends of the semiconductor layer is connected to the second metal.

Working principle of the display device in the embodiment of the present disclosure is consistent with working principle of the display panel, and specific reference may be made to the working principle of the display panel, which will not be repeated here.

The embodiment of the present disclosure provides a display panel and a display device. A pattern of a projection of a semiconductor layer on the horizontal plane is separated from the corresponding gate metal line and is disposed toward a center of each dummy pixel, so as to prevent the display device from displaying poorly due to contact between the semiconductor layer and the gate metal lines in the dummy pixel area when electrostatic discharge occurs, thereby improving the display device yield.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

The invention claimed is:

1. A display panel, comprising:
a display area configured to display an image; and
a dummy pixel area disposed outside of the display area and having a plurality of dummy pixels disposed therein, each dummy pixel comprising a pixel protection unit, the dummy pixels defined by crisscrossing data metal lines and gate metal lines in a vertical direction and a horizontal direction, respectively;
wherein the pixel protection unit comprises a metal layer and a semiconductor layer, the metal layer comprises a first metal and a second metal, and the first metal and the second metal are correspondingly disposed above two ends of the semiconductor layer; and
wherein a pattern of a projection of the first metal on a horizontal plane overlaps with a corresponding data metal line, a pattern of a projection of the second metal on the horizontal plane is separated from the corresponding data metal line and a corresponding gate metal line, and a pattern of a projection of the semiconductor layer on the horizontal plane intersects the corresponding data metal line, is separated from the corresponding gate metal line, and is disposed toward a center of each dummy pixel,
wherein the semiconductor layer is U-shaped, and an opening of the semiconductor layer correspondingly faces each dummy pixel.

2. The display panel according to claim 1, wherein one of the two ends of the semiconductor layer is connected to the first metal, and the other of the two ends of the semiconductor layer is connected to the second metal.

3. The display panel according to claim 1, further comprising a plurality of pixels having a plurality of thin film transistors disposed in the display area, each of the thin film transistors and the pixel protection unit are same except for positions of their projections relative to the corresponding gate metal line on the horizontal plane.

4. The display panel according to claim 3, wherein the data metal lines comprise a plurality of pixel data metal lines and a plurality of dummy pixel data metal lines, a projection of a source of each of the thin film transistors overlaps with a projection of a corresponding pixel data metal line on the horizontal plane, and a projection of the second metal overlaps with a projection of a corresponding dummy pixel data metal line on the horizontal plane.

5. The display panel according to claim 4, wherein the corresponding gate metal line extends across a semiconductor layer of each of the thin film transistors.

6. The display panel according to claim 1, wherein the second metal comprises an inter-layer insulating via.

7. A display panel device comprising a display panel and a backlight module, the display panel comprising:
a display area configured to display an image; and
a dummy pixel area disposed outside of the display area and having a plurality of dummy pixels disposed therein, each dummy pixel comprising a pixel protection unit, the dummy pixels defined by crisscrossing data metal lines and gate metal lines in a vertical direction and a horizontal direction, respectively;
wherein the pixel protection unit comprises a metal layer and a semiconductor layer, the metal layer comprises a first metal and a second metal, and the first metal and the second metal are correspondingly disposed above two ends of the semiconductor layer; and
wherein a pattern of a projection of the first metal on a horizontal plane overlaps with a corresponding data metal line, a pattern of a projection of the second metal on the horizontal plane is separated from the corresponding data metal line and a corresponding gate metal line, and a pattern of a projection of the semiconductor layer on the horizontal plane intersects the corresponding data metal line, is separated from the corresponding gate metal line, and is disposed toward a center of each dummy pixel,
wherein the semiconductor layer is U-shaped, and an opening of the semiconductor layer correspondingly faces each dummy pixel.

8. The display panel device according to claim 7, wherein one of the two ends of the semiconductor layer is connected to the first metal, and the other of the two ends of the semiconductor layer is connected to the second metal.

* * * * *